United States Patent
Koo et al.

(10) Patent No.: US 12,081,227 B2
(45) Date of Patent: Sep. 3, 2024

(54) DIGITAL-TO-ANALOG CONVERTER AND APPARATUS INCLUDING THE SAME

(71) Applicant: SAMSUNG ELECTRONICS CO., LTD., Suwon-si (KR)

(72) Inventors: Byungwoo Koo, Suwon-si (KR); Sangpil Nam, Pohang-si (KR); Sunghan Do, Suwon-si (KR); Junsang Park, Seoul (KR); Jungho Lee, Anyang-si (KR); Youngjae Cho, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 17/748,746

(22) Filed: May 19, 2022

(65) Prior Publication Data
US 2023/0071628 A1 Mar. 9, 2023

(30) Foreign Application Priority Data

Sep. 3, 2021 (KR) .................. 10-2021-0117944

(51) Int. Cl.
*H03M 1/66* (2006.01)
*H03F 3/20* (2006.01)
*H04B 1/00* (2006.01)

(52) U.S. Cl.
CPC .............. *H03M 1/66* (2013.01); *H03F 3/20* (2013.01); *H04B 1/005* (2013.01)

(58) Field of Classification Search
CPC ................................ H03M 1/66; H03M 1/70
USPC .......................................... 341/118, 120, 144
See application file for complete search history.

(56) References Cited

U.S. PATENT DOCUMENTS

| | | | |
|---|---|---|---|
| 6,344,816 | B1 | 2/2002 | Dedic |
| 6,781,537 | B1 | 8/2004 | Taraschuk et al. |
| 7,345,609 | B2 | 3/2008 | Briaire |
| 8,022,851 | B2 | 9/2011 | Joseph |
| 8,154,432 | B2 | 4/2012 | Kaper et al. |
| 8,514,112 | B2 | 8/2013 | McLachlan et al. |
| 8,564,463 | B2 | 10/2013 | Agi |
| 9,218,816 | B2 | 12/2015 | Torii et al. |

(Continued)

FOREIGN PATENT DOCUMENTS

JP 3950405 B2 8/2007

OTHER PUBLICATIONS

Extended European Search Report issued from the European Patent Office on Jan. 30, 2023 to EP Application No. 22193673.5.

*Primary Examiner* — Peguy Jean Pierre
(74) *Attorney, Agent, or Firm* — Sughrue Mion, PLLC

(57) ABSTRACT

An apparatus configured to transmit and receive a radio frequency (RF) signal is provided. The apparatus includes a digital-to-analog converter (DAC) configured to convert a digital signal into an analog signal, a power amplifier configured to amplify the analog signal, and an antenna configured to output, as the RF signal, the amplified analog signal to the outside. The DAC includes a current cell matrix including a plurality of current cells configured to generate the analog signal, a plurality of normal paths configured to control the plurality of current cells to be turned on or off, based on the digital signal, and a plurality of alternative paths configured to selectively consume power, based on a pattern of the digital signal.

20 Claims, 16 Drawing Sheets

(56) References Cited

U.S. PATENT DOCUMENTS

| | | | |
|---|---|---|---|
| 9,716,508 B1 | 7/2017 | Zhang | |
| 9,900,016 B1 | 2/2018 | Trampitsch et al. | |
| 10,581,442 B2 | 3/2020 | Kauffman et al. | |
| 10,693,483 B1 | 6/2020 | Luo et al. | |
| 10,862,493 B2 | 12/2020 | Agrawal et al. | |
| 2007/0126616 A1 | 6/2007 | Cho et al. | |
| 2015/0295584 A1* | 10/2015 | Das | H03M 1/002 |
| | | | 341/154 |
| 2021/0175896 A1* | 6/2021 | Melanson | H03M 3/502 |

* cited by examiner

DIGITAL-TO-ANALOG CONVERTER AND APPARATUS INCLUDING THE SAME

CROSS-REFERENCE TO RELATED APPLICATION

This application is based on and claims priority under 35 U.S.C. § 119 to Korean Patent Application No. 10-2021-0117944, filed on Sep. 3, 2021, in the Korean Intellectual Property Office, the disclosure of which is incorporated by reference herein in its entirety.

BACKGROUND

1. Field

The disclosure relates generally to a digital-to-analog converter (DAC), and more particularly, to a DAC converting a digital signal to an analog signal and an apparatus including the same.

2. Description of Related Art

An output of a DAC included in an apparatus or transmitter may be up-converted into a higher frequency band using a radio frequency (RF) generator and a mixer and then transmitted as an RF signal to the outside via a power amplifier and an antenna. Recently, a direct RF synthesis architecture without the structure of an RF generator and a mixer has been used. To cover RF signals corresponding to a high frequency band, DACs using a direct RF synthesis architecture are required to maintain high linearity at a high operating frequency while operating.

SUMMARY

Provided are a digital-to-analog converter (DAC) for ensuring high linearity while operating at a high frequency to generate a radio frequency (RF) signal and an apparatus including the same.

Additional aspects will be set forth in part in the description which follows and, in part, will be apparent from the description, or may be learned by practice of the presented embodiments.

In accordance with an aspect of the disclosure, an apparatus configured to transmit and receive an RF signal may include a DAC configured to convert a digital signal into an analog signal, a power amplifier configured to amplify the analog signal, and an antenna configured to output, as the RF signal, the amplified analog signal to the outside. The DAC includes a current cell matrix including a plurality of current cells configured to generate the analog signal, a plurality of normal paths configured to control the plurality of current cells to be turned on or off, based on the digital signal, and a plurality of alternative paths configured to selectively consume power, based on a pattern of the digital signal.

In accordance with an aspect of the disclosure, a DAC configured to convert a digital signal including a plurality of pieces of digital data into an analog signal may include a data decoder configured to decode n-ary digital data into the plurality of pieces of digital data, based on a thermometer code, where n is an integer of at least 2, a current cell matrix including a plurality of current cells configured to generate the analog signal, a first alternative path including a first latch circuit configured to create a toggle in first dummy data, a first normal path including a second latch circuit configured to control a first current cell among the plurality of current cells to be turned on or off, and a first path selector configured to control at least one of the first alternative path and the first normal path, based on a pattern of first digital data among the plurality of pieces of digital data.

In accordance with an aspect of the disclosure, a DAC configured to convert a digital signal including a plurality of pieces of digital data into an analog signal may include a current cell matrix including a plurality of current cells configured to generate the analog signal, a plurality of normal paths connected to the plurality of current cells and configured to control turning the plurality of current cells on or off, based on the plurality of pieces of digital data, and a plurality of alternative paths configured to selectively perform internal toggling on a plurality of pieces of dummy data, based on patterns of the plurality of pieces of digital data.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
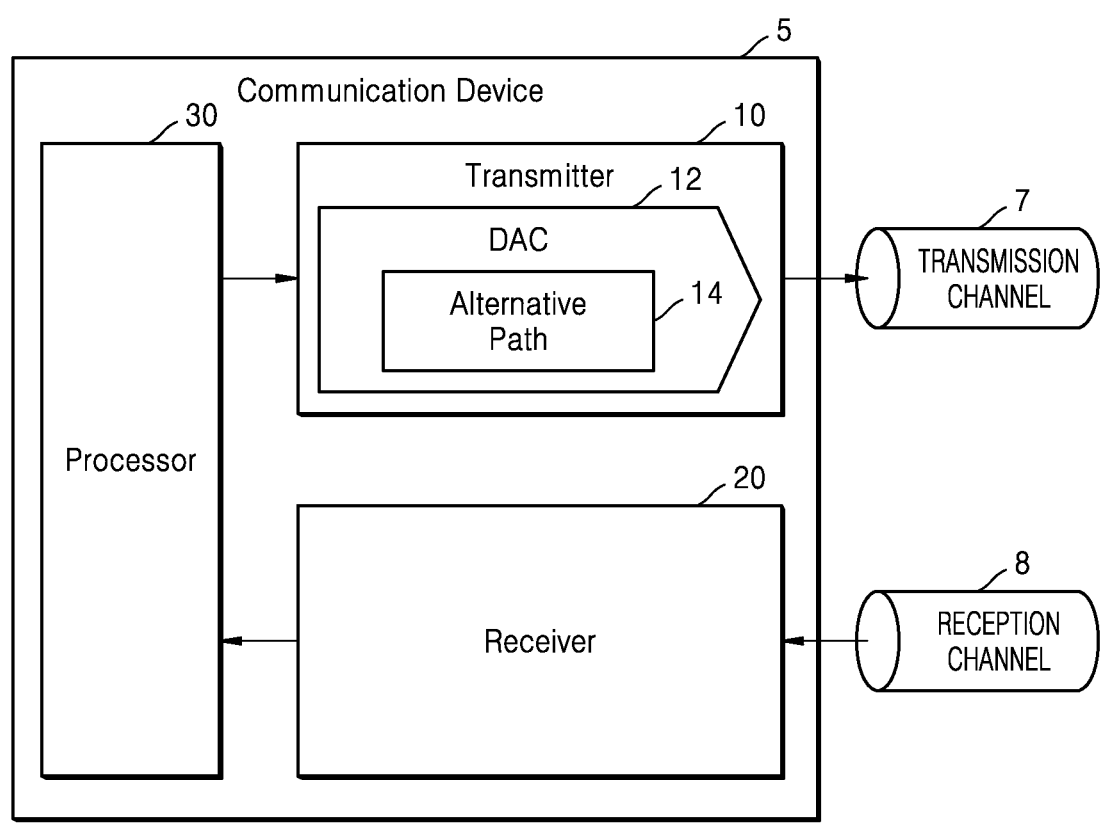
FIG. 1 is a diagram of an apparatus according to an embodiment.

FIG. 1 is a diagram of an apparatus 5 according to an embodiment.

Descriptions below are given based on the fact that the apparatus 5 of FIG. 1 is a communication apparatus, which may support fifth-generation (5G) communication, long-term evolution (LTE) communication, code division multiple access (CDMA) communication, global system for mobile communications (GSM) communication, wireless local area network (WLAN) communication, or next generation communication. However, this is just an example, and embodiments are not limited thereto. For example, the apparatus 5 may include at least one selected from a smartphone, a tablet personal computer (PC), a mobile phone, a video phone, an e-book reader, a desktop PC, a laptop PC, a netbook computer, a personal digital assistant (PDA), a portable multimedia player (PMP), an MP3 player, a mobile medical device, a camera, and a wearable device (e.g., a head-mounted device (HMD) like electronic glasses, electronic clothes, an electronic bracelet, an electronic necklace, an electronic accessory, an electronic tattoo, or a smart watch).

According to some embodiments, the apparatus 5 may correspond to a smart home appliance having an image display function. For example, the smart home appliance may include at least one selected from a television (TV), a digital video disk (DVD) player, an audio player, a refrigerator, an air conditioner, a vacuum cleaner, an oven, a microwave, a washing machine, an air cleaner, a set-top box, a TV box (e.g., Samsung HomeSync™, Apple TV™, or Google TV™), a game console, an electronic dictionary, an electronic key, a camcorder, and an electronic picture frame.

According to some embodiments, the apparatus 5 may include at least one selected from various medical devices (e.g., a magnetic resonance angiography (MRA) apparatus, a magnetic resonance imaging (MRI) apparatus, a computed tomography (CT) scanner, an imaging machine, and a sonograph), a navigation device, a global positioning system (GPS) receiver, an event data recorder (EDR), a flight data recorder (FDR), an automobile infotainment device, electronic equipment for ships (e.g., navigation equipment for ships and a gyrocompass), avionics, security equipment, an automobile head unit, an industrial robot, a home robot, an automatic teller's machine (ATM), and a point-of-sale (POS) system.

According to some embodiments, the apparatus 5 may include at least one of furniture having an image display function, a portion of a building or structure having an image display function, an electronic board, an electronic signature-receiving device, a projector, and various measuring instruments (e.g., a water meter, an electricity meter, a gas meter, and a radio wave measuring device).

Referring to FIG. 1, the apparatus 5 may include a transmitter 10, a receiver 20, and a processor 30. The transmitter 10 may transmit a radio frequency (RF) signal to a base station or another apparatus through a transmission channel 7. The receiver 20 may receive an RF signal from a base station or another apparatus through a reception channel 8.

The processor 30 may generally control various operations of the apparatus 5 and process data necessary for the operations. The processor 30 may include a baseband processor. For example, the processor 30 may provide a digital signal to the transmitter 10 or receive a digital signal from the receiver 20.

In an example embodiment, the transmitter 10 may include a digital-to-analog converter (DAC) 12, which converts a digital signal received from the processor 30 into an analog signal. In an example embodiment, the transmitter 10 may have a direct RF synthesis architecture without a mixer, and accordingly, the DAC 12 may generate an analog signal corresponding to the frequency band of an RF signal output from the transmitter 10. In other words, the DAC 12 may generate analog signals in a wide frequency band from a low frequency band to a high frequency band (e.g., a millimeter-wave band). However, this is just an example, and embodiments may also be applied to an up-conversion architecture and an intermediate frequency architecture.

In an example embodiment, the DAC 12 may include a plurality of alternative paths 14. The alternative paths 14 may selectively perform internal toggling during the digital-to-analog conversion operation of the DAC 12 such that power consumption is uniform during the operation of the DAC 12. The DAC 12 may further include a current cell matrix, which includes a plurality of current cells for generating an analog signal, and a plurality of normal paths, which are connected to the current cells and configured to control the current cells to be turned on or off based on a plurality of pieces of digital data. A digital signal that the DAC 12 receives from the processor 30 may include the pieces of digital data.

In an example embodiment, the alternative paths 14 may selectively perform internal toggling on a plurality of pieces of dummy data, which are generated in the alternative paths 14, based on a pattern of each of the pieces of digital data. The pattern of digital data may refer to a level change of the digital data. The detailed descriptions thereof are given below.

In an example embodiment, the alternative paths 14 may be activated or deactivated according to the operation mode of the apparatus 5. For example, the alternative paths 14 may be activated when the apparatus 5 operates in a low-power mode and deactivated when the apparatus 5 operates in a normal mode. The operation mode of the apparatus 5 may be interpreted as the operation mode of the DAC 12. In some embodiments, the alternative paths 14 may be activated or deactivated according to a communication status of the apparatus 5. For example, when the communication status of the apparatus 5 is greater than or equal to a threshold value and thus good, the alternative paths 14 may be deactivated to reduce power consumption instead of ensuring the high linearity of the DAC 12. When the communication status is less than the threshold value and thus poor, the alternative paths 14 may be activated to ensure the high linearity of the DAC 12 instead of low power consumption of the DAC 12.

The transmitter 10 and the receiver 20 may be implemented in an RF integrated circuit and may include an amplifier, an oscillator, a filter, a frequency divider, or the like, which may be required to transmit or receive an RF signal.

According to an example embodiment, the DAC 12 may uniformly consume electric power through the alternative paths 14, which selectively perform internal toggling, during a conversion operation. As a result, enhanced linearity is ensured, and accordingly, the performance of the DAC 12 may be increased.

Figure 2A:
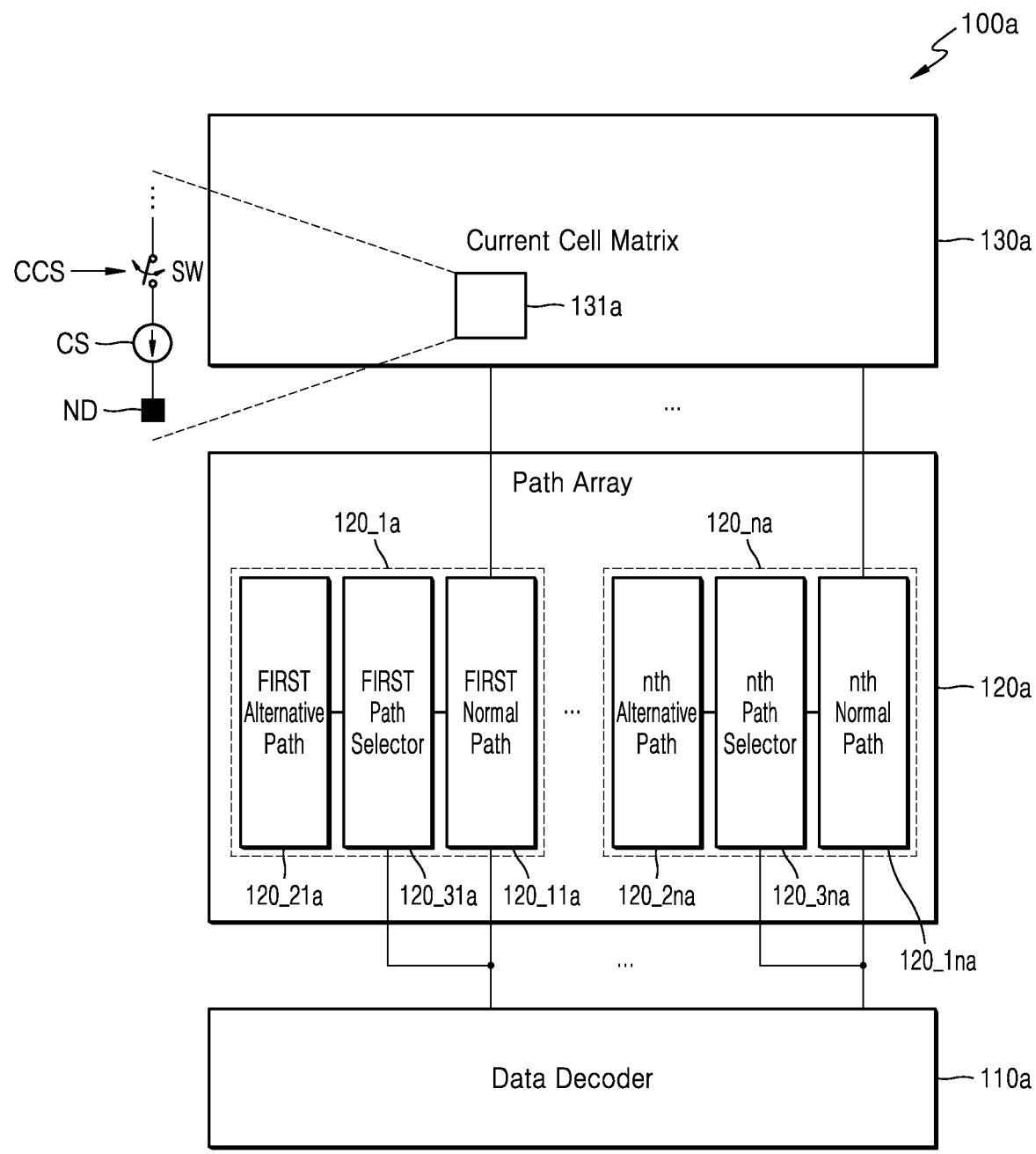
FIGS. 2A and 2B are diagrams of digital-to-analog converters (DACs) according to an embodiment.
Figure 2B:
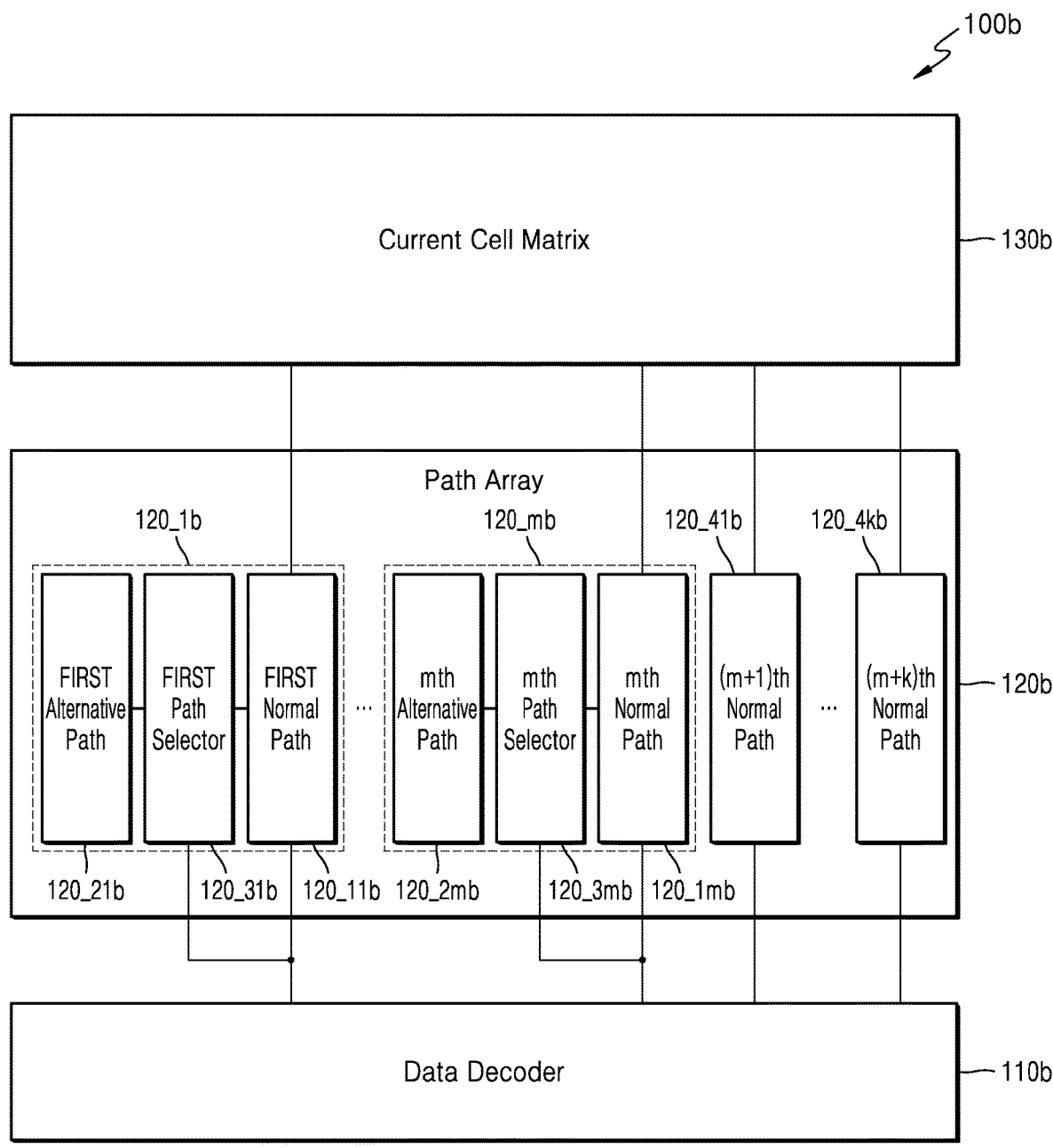

FIGS. 2A and 2B are diagrams of DACs according to an embodiment.

Referring to FIG. 2A, the DAC 100a may include a data decoder 110a, a path array 120a, and a current cell matrix 130a. In an example embodiment, the data decoder 110a may convert n-ary digital data (where "n" is an integer of at least 2) received from the processor 30 (FIG. 1) into certain digital data that may be processed by the DAC 100a. For example, the data decoder 110a may convert n-ary digital data into digital data based on a thermometer code. In some embodiments, the data decoder 110a may be included in the processor 30 (FIG. 1) and omitted from the DAC 100a. The data decoder 110a may provide a plurality of pieces of decoded digital data to the path array 120a.

In an example embodiment, the path array 120a may include first to n-th path groups 120_1a to 120_na. Hereinafter, descriptions are mainly given on the configuration of the first path group 120_1a, and the descriptions thereof may also be applied to the other path groups, i.e., the second to n-th path groups 120_2a to 120_na. The current cell matrix 130a may include a plurality of current cells, which are controlled to be turned on or off to generate an analog signal. Among the current cells, a first current cell 131a may receive a cell control signal CCS from the first path group 120_1a and include a switch SW, a current source CS, and an output node ND. The first current cell 131a may output a current corresponding to the current source CS through the output node ND in response to the cell control signal CCS. The configuration of the first current cell 131a may also be applied to the other current cells of the current cell matrix 130a, and each of the other current cells may receive a cell control signal from a corresponding one of the other path groups, i.e., the second to n-th path groups 120_2a to 120_na.

In an example embodiment, the first path group 120_1a may include a first normal path 120_11a, a first alternative path 120_21a, and a first path selector 120_31a. The first alternative path 120_21a may include a first latch circuit, which creates a toggle in first dummy data. The first normal path 120_11a may include a second latch circuit, which receives and outputs normal data corresponding to the cell control signal CCS for the first current cell 131a. A latch circuit included in an alternative path may be defined as the first latch circuit, and a latch circuit included in a normal path may be defined as the second latch circuit. In addition, the normal data transmitted to the second latch circuit may correspond to digital data provided from the data decoder 110a. In an example embodiment, the first latch circuit included in the first alternative path 120_21a may include a floating output terminal, and the second latch circuit included in the first normal path 120_11a may include an output terminal that outputs a cell control signal to the first current cell 131a. A normal path may refer to a circuit that generates a cell control signal provided to a current cell, and an alternative path may refer to a circuit that selectively performs internal toggling in correspondence to the operation of the normal path.

In an example embodiment, the first path selector 120_31a may control at least one of the first normal path 120_11a and the first alternative path 120_21a based on the pattern of first digital data provided from the data decoder 110a. The level of normal data of the second latch circuit included in the first normal path 120_11a may be maintained or changed according to the level of the first digital data provided from the data decoder 110a. The level of data or a signal may mean the value of data or a signal and may be interchangeably used with the value of data or a signal.

The number of pieces of normal data having changed levels among a plurality of pieces of normal data transmitted to respective second latches of normal paths 120_11a to 120_1na of the path array 120a may vary with a plurality of pieces of digital data provided from the data decoder 110a, and accordingly, power consumed by the normal paths 120_11a to 120_1na may be dependent on the pieces of digital data. An irregular change in power consumption of the normal paths 120_11a to 120_1na may cause degradation in the linearity of the DAC 100a in conjunction with parasitic resistance between the power supply and ground of the DAC 100a. According to an example embodiment, to eliminate such a factor, a plurality of alternative paths 120_21a to 120_2na may selectively perform internal toggling in response to a change in power consumption of the normal paths 120_11a to 120_1na, thereby allowing the power consumption of the path array 120a to be uniform.

In an example embodiment, when the current level of the first digital data is the same as the previous level of the first digital data, the first path selector 120_31a may control the first alternative path 120_21a such that dummy data transmitted to the first latch circuit toggles. For example, when the current level of the first digital data is different from the previous level of the first digital data, the first path selector 120_31a may control the first normal path 120_11a such that normal data transmitted to the second latch circuit toggles.

In an example embodiment, the first path selector 120_31a may control the power consumption of the first path group 120_1a to be uniform by allowing dummy data, which is transmitted to the first latch circuit of the first alternative path 120_21a, to toggle when normal data, which is transmitted to the second latch circuit of the first normal path 120_11a, does not toggle. The operation of the first path selector 120_31a described above may also be applied to other path selectors 120_32a to 120_32n. In some embodiments, a path selector may be referred to as a path controller.

In an example embodiment, the first path selector 120_31a may activate or deactivate the first alternative path 120_21a according to the operation mode of the DAC 100a. For example, when the DAC 100a operates in a low-power mode, the first path selector 120_31a may deactivate the first alternative path 120_21a to reduce power consumption by the first alternative path 120_21a. In an example embodiment, the first path selector 120_31a may activate or deactivate the first alternative path 120_21a according to the communication status of an apparatus including the DAC 100a. For example, when the communication status (e.g., a channel status) is greater than or equal to a threshold value, the first path selector 120_31a may deactivate the first alternative path 120_21a to reduce power consumption by the first alternative path 120_21a.

In an example embodiment, the first alternative path 120_21a may include a circuit, which is copied from the first normal path 120_11a, such that the first alternative path 120_21a has power consumption as similar as possible to the first normal path 120_11a during internal toggling. In detail, the first alternative path 120_21a may include a buffer circuit, which is copied from a buffer circuit of the first normal path 120_11a, and the first latch circuit, which is copied from the second latch circuit of the first normal path 120_11a. A copied circuit may have a characteristic, e.g., the degree of delay or amplification, which is similar to or the same as the characteristic of an original circuit.

Although it is illustrated in FIG. 2A that the elements of each of the first to n-th path groups 120_1a to 120_na of the path array 120a are adjacent to one another, this is just an example. The normal paths 120_11a to 120_1na may be adjacent to one another, the alternative paths 120_21a-120_2na may be adjacent to one another, and the path selectors 120_31a-120_3na may be adjacent to one another.

In an example embodiment, the data decoder 110a and the path array 120a may be implemented as a digital logic, and the current cell matrix 130a may be implemented as an analog logic. In some embodiments, the data decoder 110a and the path array 120a may be implemented as an analog logic or a combination of a digital logic and an analog logic.

Referring to FIG. 2B, different from the path array 120a in FIG. 2A, a path array 120b may include first to m-th path groups 120_1b to 120_mb (where "m" is an integer of at least 2) and (m+1)-th to (m+k)-th normal paths 120_41b to 120_4kb (where "k" is an integer of at least 2). In other words, the number of normal paths 120_11b to 120_1mb and 120_41b to 120_4kb included in the path array 120b may be greater than the number of alternative paths 120_21b~120_2mb.

According to an example embodiment, the path array 120b may minimize power consumption by alternative paths by including a minimum number of alternative paths 120_21b~120_2mb for ensuring a linearity that is greater than or equal to a threshold value.

Figure 3:
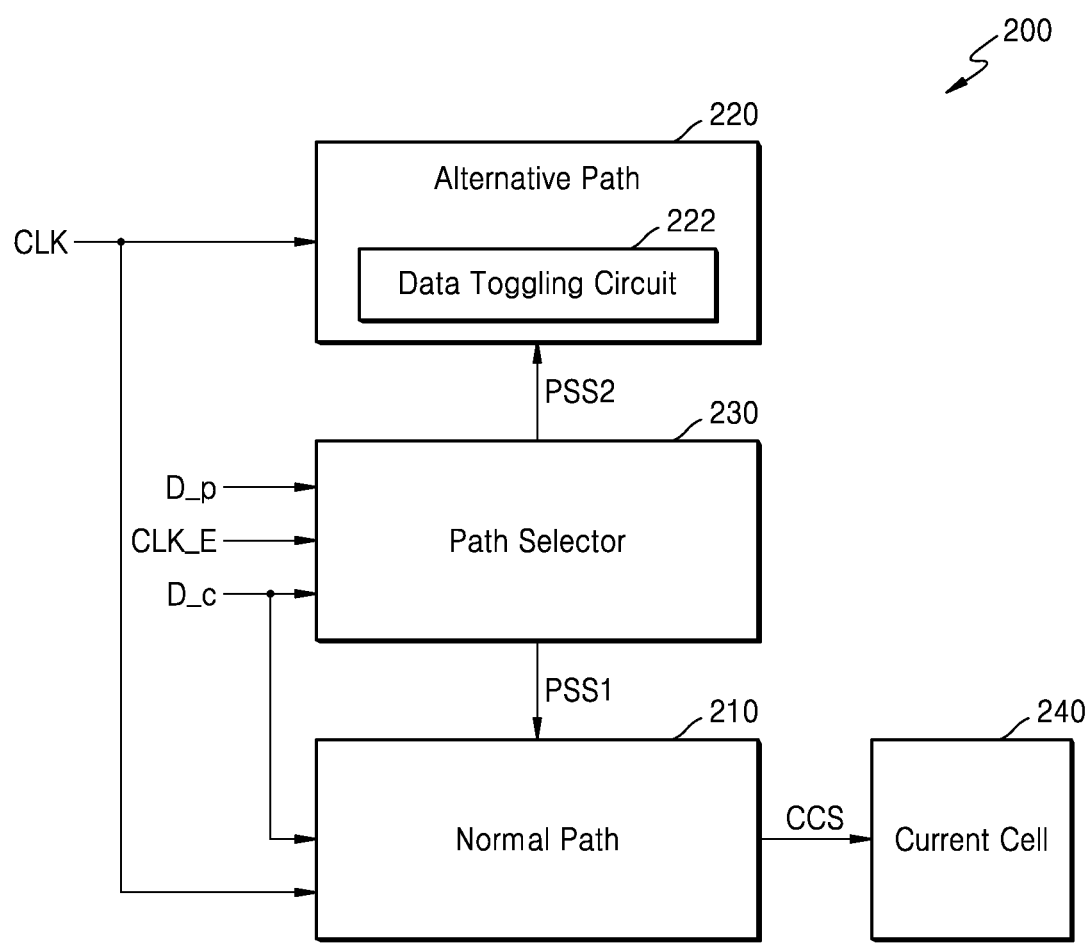
FIG. 3 is a diagram of a DAC according to an embodiment.

FIG. 3 is a diagram of a DAC 200 according to an embodiment. Although a normal path 210, an alternative path 220, a path selector 230, and a current cell 240 are illustrated in FIG. 3, the DAC 200 may include additional normal paths, alternative paths, path selectors, and current paths. Embodiments below may be applied to the DAC 200.

Referring to FIG. 3, the DAC 200 may include the normal path 210, the alternative path 220, the path selector 230, and the current cell 240. The normal path 210 may receive a first clock signal CLK and current digital data D_c. The alternative path 220 may receive the first clock signal CLK. The alternative path 220 may include a data toggling circuit 222 for internal toggling. The path selector 230 may receive the current digital data D_c, previous digital data D_p, and a second clock signal CLK_E. The second clock signal CLK_E may refer to a clock signal that leads the first clock signal CLK by a certain phase angle. In other words, the path selector 230 may operate based on the second clock signal CLK_E and thus control at least one selected from the normal path 210 and the alternative path 220 before the cell control signal CCS based on the current digital data D_c is generated. The current digital data D_c and the previous digital data D_p may respectively correspond to the current and previous levels of digital data.

In an example embodiment, the path selector 230 may compare the current digital data D_c with the previous digital data D_p, based on the second clock signal CLK_E, and generate first and second path selection signals PSS1 and PSS2, based on a comparison result. The path selector 230 may provide the first path selection signal PSS1 to the normal path 210 and the second path selection signal PSS2 to the alternative path 220.

In detail, when the current digital data D_c is different from the previous digital data D_p, the path selector 230 may generate and provide the first path selection signal PSS1 to the normal path 210 such that the current digital data D_c is transmitted to the second latch circuit of the normal path 210 and generate and provide the second path selection signal PSS2 to the alternative path 220 such that dummy data of the first latch circuit of the alternative path 220 does not toggle.

When the current digital data D_c is the same as the previous digital data D_p, the path selector 230 may generate and provide the first path selection signal PSS1 to the normal path 210 such that the first clock signal CLK is not transmitted to the second latch circuit of the normal path 210 and generate and provide the second path selection signal PSS2 to the alternative path 220 such that dummy data of the first latch circuit of the alternative path 220 toggles. For example, the data toggling circuit 222 may provide dummy data, which toggles based on the second path selection signal PSS2, to the first latch circuit, and the first latch circuit may output the toggling dummy data in response to the first clock signal CLK, thereby performing internal toggling.

Through the control operation of the path selector 230, a period in which normal data of the second latch circuit of the normal path 210 toggles may be different from a period in which dummy data of the first latch circuit of the alternative path 220 toggles. In other words, the alternative path 220 may perform internal toggling in a period in which normal data of the second latch circuit of the normal path 210 does not toggle. The normal path 210 may provide the cell control signal CCS, which has a value corresponding to normal data transmitted to the second latch circuit, to the current cell 240.

Figure 4:
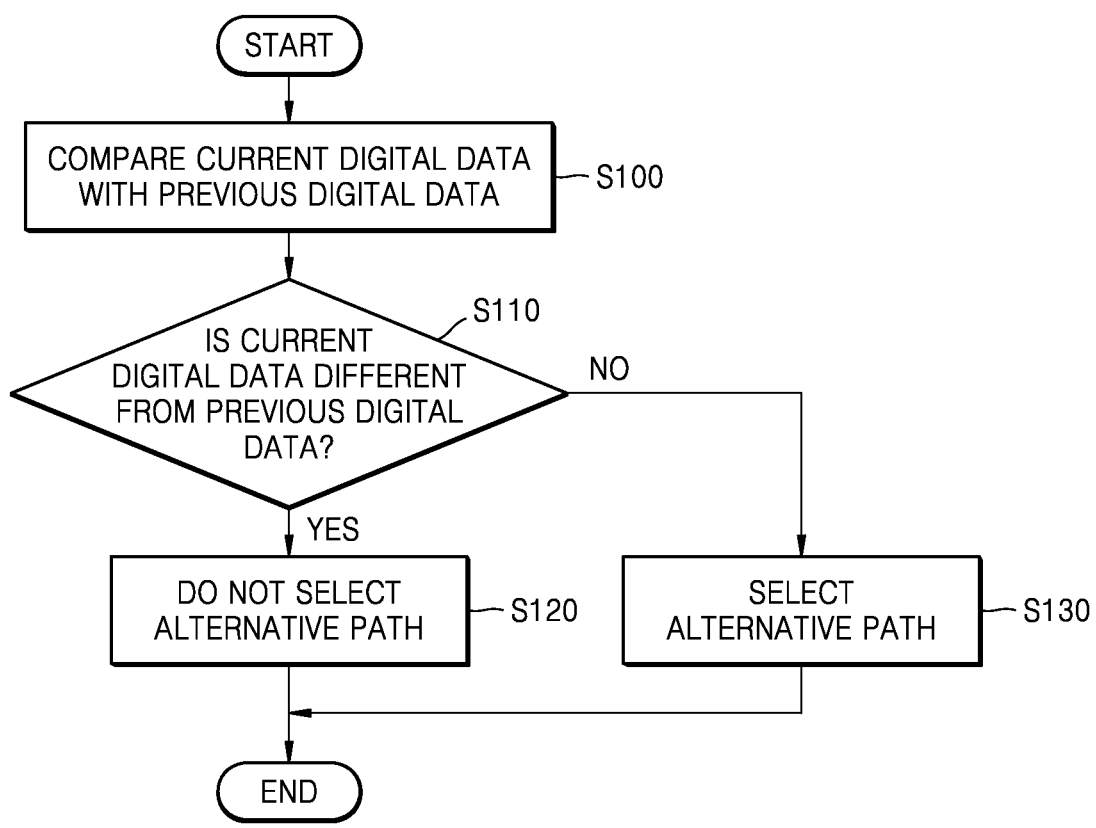
FIG. 4 is a flowchart of the operations of a DAC, according to an embodiment.

FIG. 4 is a flowchart of the operations of a DAC, according to an embodiment. For clear understanding, FIG. 4 is described with reference to FIG. 3.

Referring to FIG. 4, the path selector 230 may compare the current digital data D_c with the previous digital data D_p in operation S100. The path selector 230 may determine whether the current digital data D_c is different from the previous digital data D_p in operation S110. When the answer is "YES" in operation S110, the path selector 230 may not select the alternative path 220 and may control only the normal path 210 to operate in operation S120. Otherwise, when the answer is "NO" in operation S110, the path selector 230 may select and control the alternative path 220 to perform internal toggling in operation S130.

Figure 5:
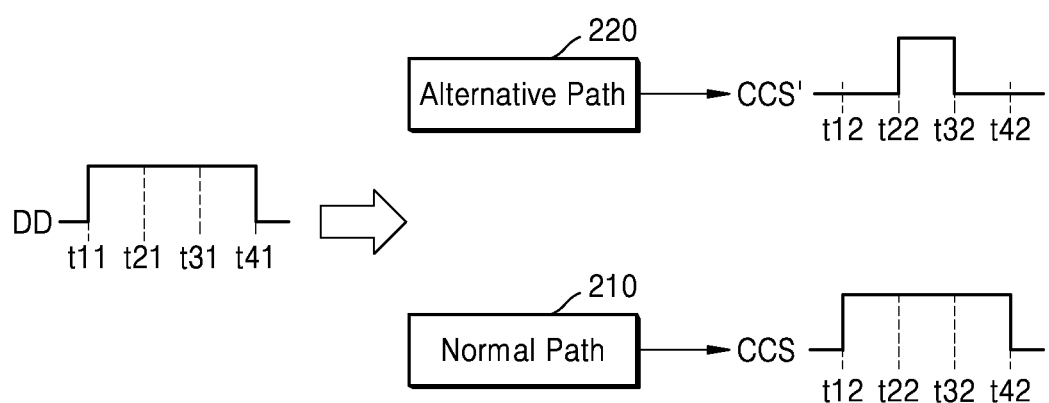
FIG. 5 is a diagram of the operations of a normal path and an alternative path in FIG. 3, according to an embodiment.

FIG. 5 is a diagram of the operations of the normal path 210 and the alternative path 220 in FIG. 3, according to an embodiment.

Referring to FIG. 5, when the DAC 200 receives digital data DD, the normal path 210 and the alternative path 220 may respectively output the cell control signal CCS and a dummy cell control signal CCS' in response to the digital data DD. For example, the digital data DD may transit from a low level to a high level at "t11", remain at the high level from "t11" to "t41", and transit from the high level to the low level at "t41". In response to the digital data DD, the normal path 210 may generate the cell control signal CCS that transits from a low level to a high level at "t12", remains at the high level from "t12" to "t42", and transits from the high level to the low level at "t42". The alternative path 220 may generate the dummy cell control signal CCS' that toggles in a period from "t22" to "t32", in which the cell control signal CCS does not toggle. An output terminal of the alternative path 220, which outputs the dummy cell control signal CCS', may float.

Figure 6:
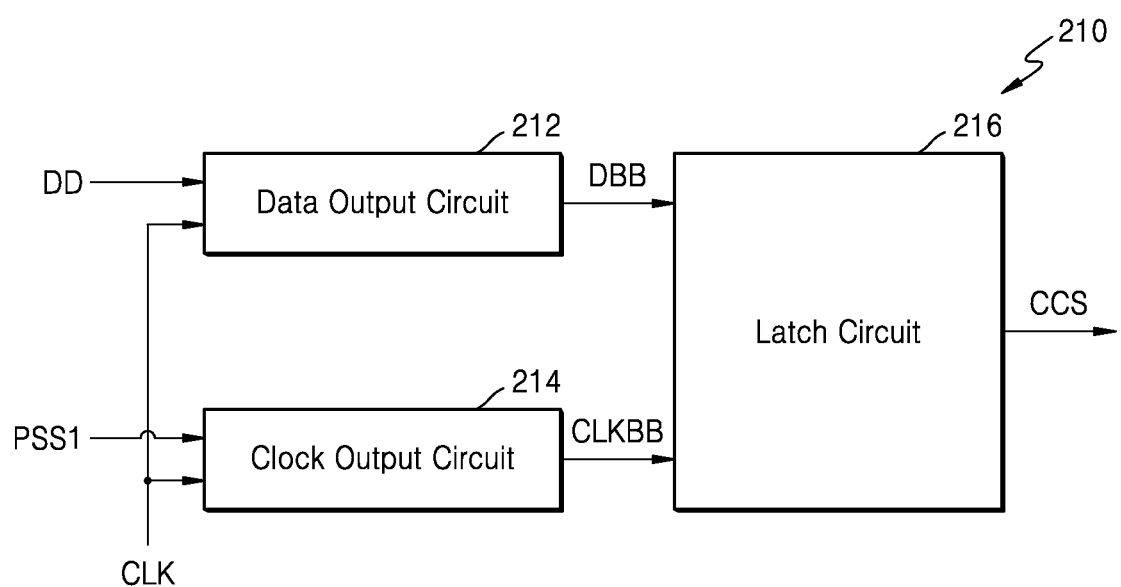
FIG. 6 is a diagram of a normal path according to an embodiment.

FIG. 6 is a block diagram of the normal path 210 according to an embodiment.

Referring to FIG. 6, the normal path 210 may include a data output circuit 212, a clock output circuit 214, and a latch circuit 216. The latch circuit 216 may be referred to as the second latch circuit. The data output circuit 212 may receive the digital data DD and the first clock signal CLK and output second output data DBB to the latch circuit 216. In an example embodiment, the second output data DBB may result from buffering the digital data DD and have a different phase or size than the digital data DD.

The clock output circuit 214 may receive the first path selection signal PSS1 and the first clock signal CLK, generate a second output clock signal CLKBB from the first clock signal CLK, based on the first path selection signal PSS1, and output the second output clock signal CLKBB to the latch circuit 216. In an example embodiment, the second output clock signal CLKBB may result from buffering the first clock signal CLK and have a different phase or magnitude than the first clock signal CLK. For example, when the current level of the digital data DD is different from the previous level of the digital data DD, the first path selection signal PSS1 may have a first level (or a first value), and the clock output circuit 214 may generate and output the second output clock signal CLKBB to the latch circuit 216 in response to the first path selection signal PSS1 having the first level. Otherwise, when the current level of the digital data DD is the same as the previous level of the digital data DD, the first path selection signal PSS1 may have a second level (or a second value), and the clock output circuit 214 may not output the second output clock signal CLKBB in response to the first path selection signal PSS1 having the second level. In an example embodiment, the clock output circuit 214 may output a signal, which is maintained at a certain level, instead of the second output clock signal CLKBB.

The normal path 210 of FIG. 6 may include the clock output circuit 214 that selectively provides the second output clock signal CLKBB to the latch circuit 216, based on the first path selection signal PSS1. However, this is just an example, and embodiments are not limited thereto. The clock output circuit 214 may be configured to continuously provide the second output clock signal CLKBB to the latch circuit 216 without receiving the first path selection signal PSS1.

In some embodiments, the data output circuit 212 may provide output data (e.g., first output data DB in FIG. 9), which has an opposite phase to the second output data DBB, to the latch circuit 216, and the clock output circuit 214 may output an output clock signal (e.g., a first output clock signal CLKB in FIG. 9), which has an opposite phase to the second output clock signal CLKBB, to the latch circuit 216.

Figure 7:
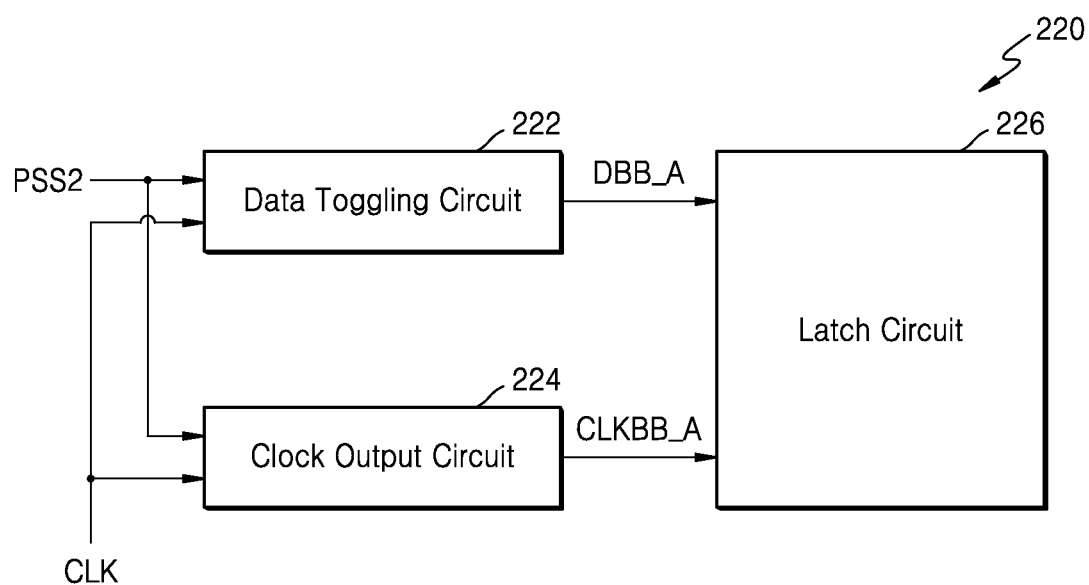
FIG. 7 is a diagram of an alternative path according to an embodiment.

FIG. 7 is a diagram of the alternative path 220 according to an embodiment.

Referring to FIG. 7, the alternative path 220 may include a data toggling circuit 222, a clock output circuit 224, and a latch circuit 226. The latch circuit 226 may be referred to as the first latch circuit. The data toggling circuit 222 may receive the first clock signal CLK and the second path selection signal PSS2 and output second output dummy data DBB_A, which toggles in response to the first clock signal CLK, based on the second path selection signal PSS2. For example, when the current level of the digital data DD (FIG. 6) is the same as the previous level of the digital data DD, the second path selection signal PSS2 may have a third level (or a third value), and the data toggling circuit 222 may output the second output dummy data DBB_A, which toggles according to the first clock signal CLK, in response to the second path selection signal PSS2 having the third level. Otherwise, when the current level of the digital data DD is different from the previous level of the digital data DD, the second path selection signal PSS2 may have a fourth level (or a fourth value), and the data toggling circuit 222 may output the second output dummy data DBB_A, which is maintained at a certain level, in response to the second path selection signal PSS2 having the fourth level.

The clock output circuit 224 may receive the second path selection signal PSS2 and the first clock signal CLK, generate a second dummy clock signal CLKBB_A from the first clock signal CLK, based on the second path selection signal PSS2, and output the second dummy clock signal CLKBB_A to the latch circuit 226. In an example embodiment, the second dummy clock signal CLKBB_A may result from buffering the first clock signal CLK and have a different phase or magnitude than the first clock signal CLK. For example, when the second path selection signal PSS2 has the third level (or the third value), the clock output circuit 224 may generate the second dummy clock signal CLKBB_A in response to the second path selection signal PSS2 and output the second dummy clock signal CLKBB_A to the latch circuit 226. When the second path selection signal PSS2 has the fourth level (or the fourth value), the clock output circuit 224 may not output the second dummy clock signal CLKBB_A in response to the second path selection signal PSS2. In some embodiments, the clock output circuit 224 may output a signal, which is maintained at a certain level, instead of the second dummy clock signal CLKBB_A.

As shown in FIG. 7, the data toggling circuit 222 and the clock output circuit 224 of the alternative path 220 may receive the second path selection signal PSS2 and respectively selectively output the second output dummy data DBB_A and the second dummy clock signal CLKBB_A to the latch circuit 226. However, this is just an example, and embodiments are not limited thereto. Only one of the data toggling circuit 222 and the clock output circuit 224 may receive the second path selection signal PSS2 and perform a selective output operation, based on the second path selection signal PSS2.

In some embodiments, the data toggling circuit 222 may provide output dummy data (e.g., first output dummy data DB_A in FIG. 9), which has an opposite phase to the second output dummy data DBB_A, to the latch circuit 226, and the clock output circuit 224 may output a dummy clock signal (e.g., a first dummy clock signal CLKB_A in FIG. 9), which has an opposite phase to the second dummy clock signal CLKBB_A, to the latch circuit 226.

Figure 8:
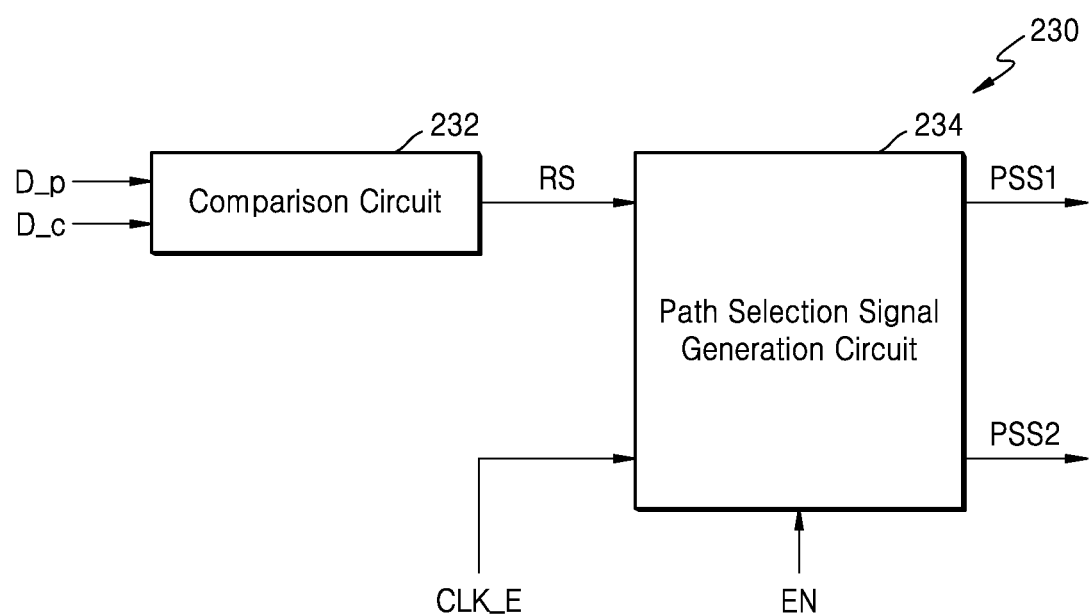
FIG. 8 is a diagram of a path selector according to an embodiment.

FIG. 8 is a diagram of the path selector 230 according to an embodiment.

Referring to FIG. 8, the path selector 230 may include a comparison circuit 232 and a path selection signal generation circuit 234. The comparison circuit 232 may receive the current digital data D_c and the previous digital data D_p, compare the current digital data D_c with the previous digital data D_p, and generate a comparison result signal RS. In other words, whether there is a level transition of digital data may be continuously monitored using the comparison circuit 232. The path selection signal generation circuit 234 may receive the comparison result signal RS and the second clock signal CLK_E. As described above, the phase of the second clock signal CLK_E may lead the phase of the first clock signal CLK (FIGS. 7 and 8), and the path selection signal generation circuit 234 may generate the first and second path selection signals PSS1 and PSS2 in response to the second clock signal CLK_E having the leading phase. In an example embodiment, the path selection signal generation circuit 234 may receive an activation/inactivation control signal EN corresponding to the operation mode of a DAC and may be activated or deactivated in response to the activation/deactivation control signal EN. In detail, when the DAC is in a low-power mode, the path selection signal generation circuit 234 may be deactivated, and alternative paths may also be deactivated such that internal toggling may not be performed. When the communication status of an apparatus including the DAC is greater than or equal to a threshold value, the path selection signal generation circuit 234 may be deactivated, and alternative paths may also be deactivated.

Figure 9:
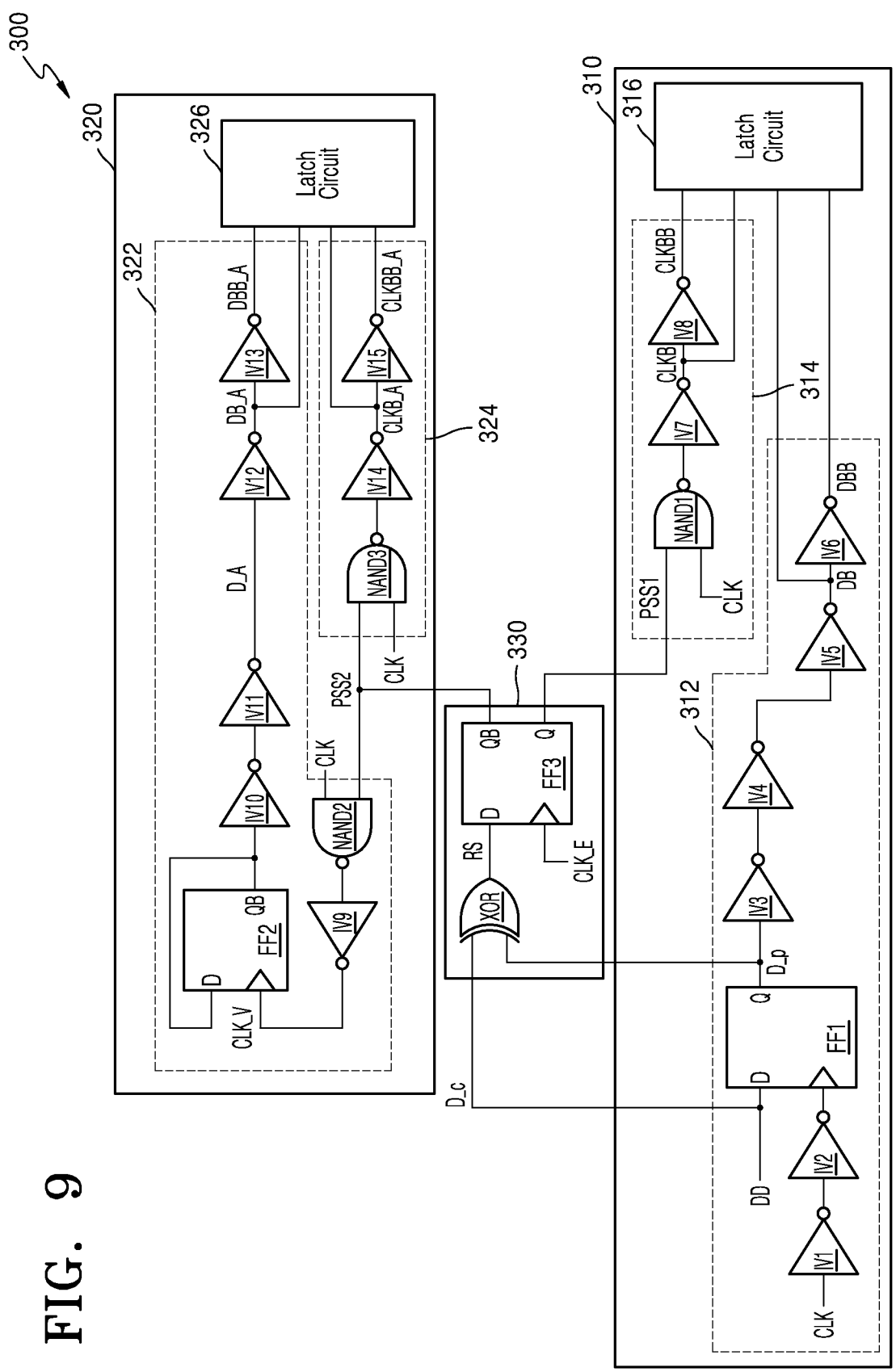
FIG. 9 is a diagram of a DAC according to an embodiment.

FIG. 9 is a diagram of a DAC 300 according to an embodiment.

Referring to FIG. 9, the DAC 300 may include a normal path 310, an alternative path 320, and a path selector 330. The normal path 310 may include a data output circuit 312, a clock output circuit 314, and a latch circuit 316. The alternative path 320 may include a data toggling circuit 322, a clock output circuit 324, and a latch circuit 326.

In an example embodiment, the data output circuit 312 may include first to sixth inverters IV1 to IV6 and a first flip-flop FF1. The first flip-flop FF1 may receive the first clock signal CLK, which has passed through the first and second inverters IV1 and IV2, and the digital data DD. The first flip-flop FF1 may output the digital data DD to the third inverter IV3 at a rising edge of the first clock signal CLK, which has passed through the first and second inverters IV1 and IV2. In other words, the first flip-flop FF1 may provide the path selector 330 with the digital data DD, which is before output to the third inverter IV3, as the current digital data D_c and the digital data DD, which is output to the third inverter IV3, as the previous digital data D_p. The first output data DB, which is generated from the previous digital data D_p that has passed through the third to fifth inverters IV3 to IV5, and the second output data DBB, which is generated from the previous digital data D_p that has passed through the third to sixth inverters IV3 to IV6, may be provided to the latch circuit 316.

In an example embodiment, the clock output circuit 314 may include a first NAND gate NAND1 and seventh and eighth inverters IV7 and IV8. The first NAND gate NAND1 may receive the first clock signal CLK and the first path selection signal PSS1. The first path selection signal PSS1 may be provided from the path selector 330. The first NAND gate NAND1 may perform a NAND operation on the first path selection signal PSS1 and the first clock signal CLK and output an operation result to the seventh inverter IV7. For example, the first NAND gate NAND1 may output the first clock signal CLK or a signal having a constant level according to the value of the first path selection signal PSS1. The first output clock signal CLKB, which is generated from the operation result of the first NAND gate NAND1 that has passed through the seventh inverter IV7, and the second output clock signal CLKBB, which is generated from the operation result of the first NAND gate NAND1 that has passed through the seventh and eighth inverters IV7 and IV8, may be provided to the latch circuit 316. The latch circuit 316 may generate a cell control signal by changing or maintaining the value of normal data in response to the first and second output data DB and DBB and the first and second output clock signals CLKB and CLKBB.

In an example embodiment, the data toggling circuit 322 may include a second NAND gate NAND2, a second flip-flop FF2, and ninth to thirteenth inverters IV9 to IV13. The second NAND gate NAND2 may receive the first clock signal CLK and the second path selection signal PSS2. The second path selection signal PSS2 may be provided from the path selector 330. The second NAND gate NAND2 may perform a NAND operation on the second path selection signal PSS2 and the first clock signal CLK and output an operation result to the ninth inverter IV9. For example, the second NAND gate NAND2 may output the first clock signal CLK or a signal having a constant level according to the value of the second path selection signal PSS2. A third clock signal CLK_V, which is generated from the operation result of the second NAND gate NAND2 that has passed through the ninth inverter IV9, may be provided to the second flip-flop FF2. The second flip-flop FF2 may output certain data, which toggles in response to the third clock signal CLK_V, to the tenth inverter IV10. The certain data may pass through the tenth and eleventh inverters IV10 and IV11 and then be provided to the twelfth inverter IV12 as dummy data D_A. The twelfth inverter IV12 and the thirteenth inverter IV13 may respectively provide first output dummy data DB_A and second output dummy data DBB_A to the latch circuit 326.

In an example embodiment, the clock output circuit 324 may include a third NAND gate NAND3 and fourteenth and fifteenth inverters IV14 and IV15. The third NAND gate NAND3 may receive the first clock signal CLK and the second path selection signal PSS2. The third NAND gate NAND3 may perform a NAND operation on the second path selection signal PSS2 and the first clock signal CLK and output an operation result to the fourteenth inverter IV14. For example, the third NAND gate NAND3 may output the first clock signal CLK or a signal having a constant level according to the value of the second path selection signal PSS2. The first dummy clock signal CLKB_A, which is generated from the operation result of the third NAND gate NAND3 that has passed through the fourteenth inverter IV14, and the second dummy clock signal CLKBB_A, which is generated from the operation result of the third NAND gate NAND3 that has passed through the fourteenth and fifteenth inverters IV14 and IV15, may be provided to the latch circuit 326.

The latch circuit 326 may generate a dummy cell control signal by changing or maintaining the value of normal data in response to the first and second output dummy data DB_A and DBB_A and the first and second dummy clock signals CLKB_A and CLKBB_A.

In an example embodiment, the path selector 330 may include an XOR gate XOR and a third flip-flop FF3. The XOR gate XOR may receive and perform an XOR operation on the current digital data D_c and the previous digital data D_p. The XOR gate XOR may provide an XOR operation result signal, i.e., the comparison result signal RS, to the third flip-flop FF3. The third flip-flop FF3 may receive the second clock signal CLK_E, of which the phase leads the phase of the first clock signal CLK, and output the first and second path selection signals PSS1 and PSS2 in response to a rising edge of the second clock signal CLK_E. For example, the first path selection signal PSS1 may have an opposite phase to the second path selection signal PSS2.

In an example embodiment, when the current digital data D_c is different from the previous digital data D_p, the path selector 330 may output the first path selection signal PSS1 at a high level and the second path selection signal PSS2 at a low level. The clock output circuit 314 of the normal path 310 may provide the first and second output clock signals CLKB and CLKBB, which are generated from the first clock signal CLK, to the latch circuit 316 in response to the first path selection signal PSS1 at the high level. The clock output circuit 324 of the alternative path 320 may provide the first and second dummy clock signals CLKB_A and CLKBB_A, of which each has a constant level, to the latch circuit 326 in response to the second path selection signal PSS2 at the low level. The data toggling circuit 322 of the alternative path 320 may provide the first and second output dummy data DB_A and DBB_A, of which each has a constant level, to the latch circuit 326 in response to the second path selection signal PSS2 at the low level. In other words, the alternative path 320 may not perform internal toggling in response to the second path selection signal PSS2 at the low level.

In an example embodiment, when the current digital data D_c is the same as the previous digital data D_p, the path selector 330 may output the first path selection signal PSS1 at a low level and the second path selection signal PSS2 at a high level. The clock output circuit 314 of the normal path 310 may provide the first and second output clock signals CLKB and CLKBB, of which each has a constant level, to the latch circuit 316 in response to the first path selection signal PSS1 at the high level. The clock output circuit 324 of the alternative path 320 may provide the first and second dummy clock signals CLKB_A and CLKBB_A, which are generated from the first clock signal CLK, to the latch circuit 326 in response to the second path selection signal PSS2 at the high level. The data toggling circuit 322 of the alternative path 320 may provide the first and second output dummy data DB_A and DBB_A, which toggles according to the third clock signal CLK_V, to the latch circuit 326 in response to the second path selection signal PSS2 at the high level. In other words, the alternative path 320 may perform internal toggling in response to the second path selection signal PSS2 at the high level.

In an example embodiment, the alternative path 320 may include a circuit copied from the normal path 310. For example, the data toggling circuit 322 of the alternative path 320 may be copied from the data output circuit 312 of the normal path 310. In detail, a path through which the first clock signal CLK is provided to the second flip-flop FF2 in the data toggling circuit 322 may be the same as or similar to a path through which the first clock signal CLK is provided to the first flip-flop FF1 in the data output circuit 312. In other words, the characteristics, e.g., phase delay, of the second NAND gate NAND2 and the ninth inverter IV9 with respect to the first clock signal CLK may be the same as or similar to the characteristics, e.g., phase delay, of the first and second inverters IV1 and IV2 with respect to the first clock signal CLK. The configuration of the tenth to thirteenth inverters IV10 to IV13 of the data toggling circuit 322 may be the same as or similar to the configuration of the third to sixth inverters IV3 to IV6 of the data output circuit 312. In other words, the phase delay characteristic of the third to sixth inverters IV3 to IV6 may be the same as or similar to the phase delay characteristic of the tenth to thirteenth inverters IV10 to IV13. The first to sixth inverters IV1 to IV6 of the data output circuit 312 may be referred to as a first buffer circuit of the data output circuit 312. The second NAND gate NAND2 and the ninth to thirteenth inverters IV9 to IV13 of the data toggling circuit 322 may be referred to as a second buffer circuit of the data toggling circuit 322. The second buffer circuit may be copied from the first buffer circuit.

For example, the clock output circuit 324 of the alternative path 320 may be copied from the clock output circuit 314 of the normal path 310. In detail, a path through which the first clock signal CLK is provided to the latch circuit 326 in the clock output circuit 324 of the alternative path 320 may be the same as or similar to a path through which the first clock signal CLK is provided to the latch circuit 316 in the clock output circuit 310 of the normal path 310. In other words, the characteristics, e.g., phase delay, of the third NAND gate NAND3 and the fourteenth and fifteenth inverters IV14 and IV15 with respect to the first clock signal CLK may be the same as or similar to the characteristics, e.g., phase delay, of the first NAND gate NAND1 and the seventh and eighth inverters IV7 and IV8 with respect to the first clock signal CLK.

The DAC 300 of FIG. 9 is one example, and embodiments are not limited thereto. Various structures allowing the alternative path 320 to selectively perform internal toggling according to the pattern of the digital data DD may be applied to the DAC 300.

Although it is illustrated in FIG. 9 that the latch circuit 316 of the normal path 310 receives the first and second output data DB and DBB and the first and second output clock signals CLKB and CLKBB, the latch circuit 316 may receive one of the first and second output data DB and DBB and one of the first and second output clock signals CLKB and CLKBB.

Although it is illustrated in FIG. 9 that the latch circuit 326 of the alternative path 320 receives the first and second output dummy data DB_A and DBB_A and the first and second dummy clock signals CLKB_A and CLKBB_A, the latch circuit 326 may receive one of the first and second output dummy data DB_A and DBB_A and one of the first and second dummy clock signals CLKB_A and CLKBB_A.

Figure 10A:
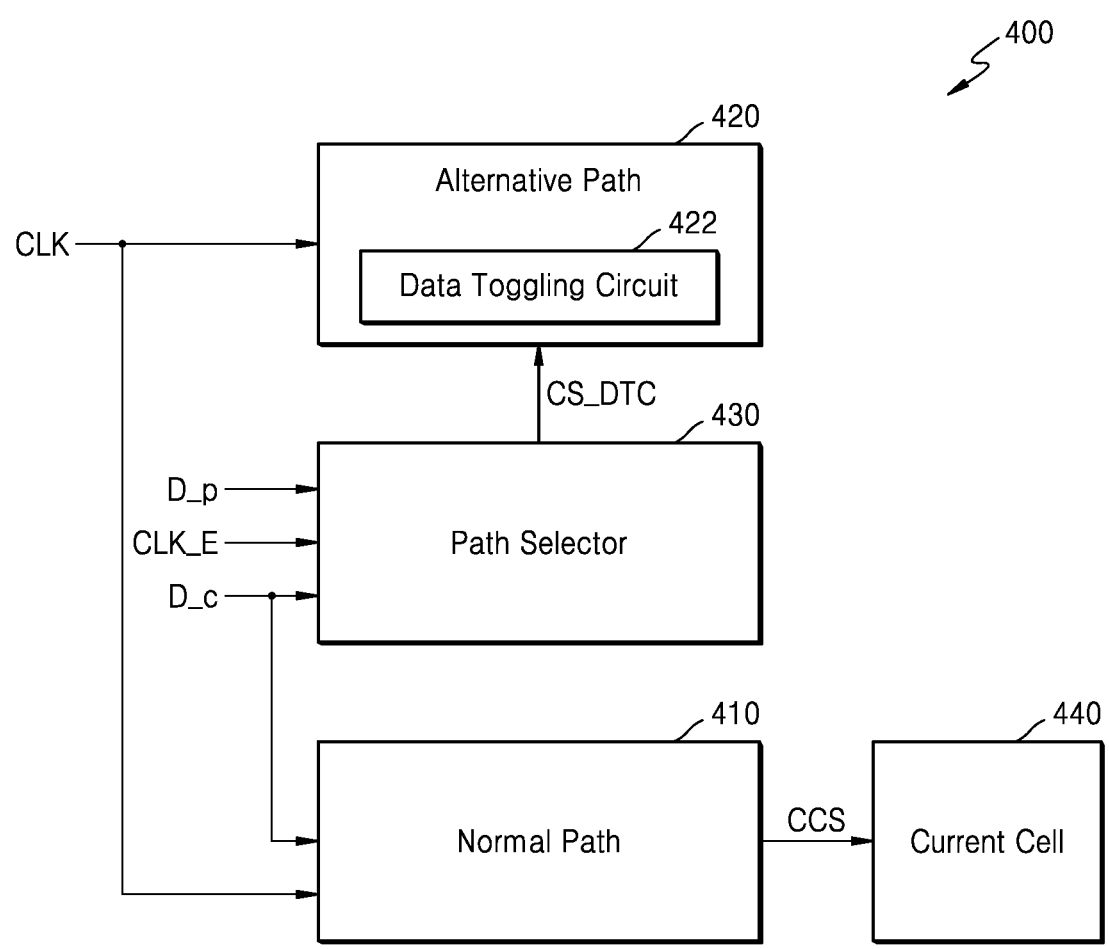
FIG. 10A is a diagram of a DAC according to an embodiment.
Figure 10B:
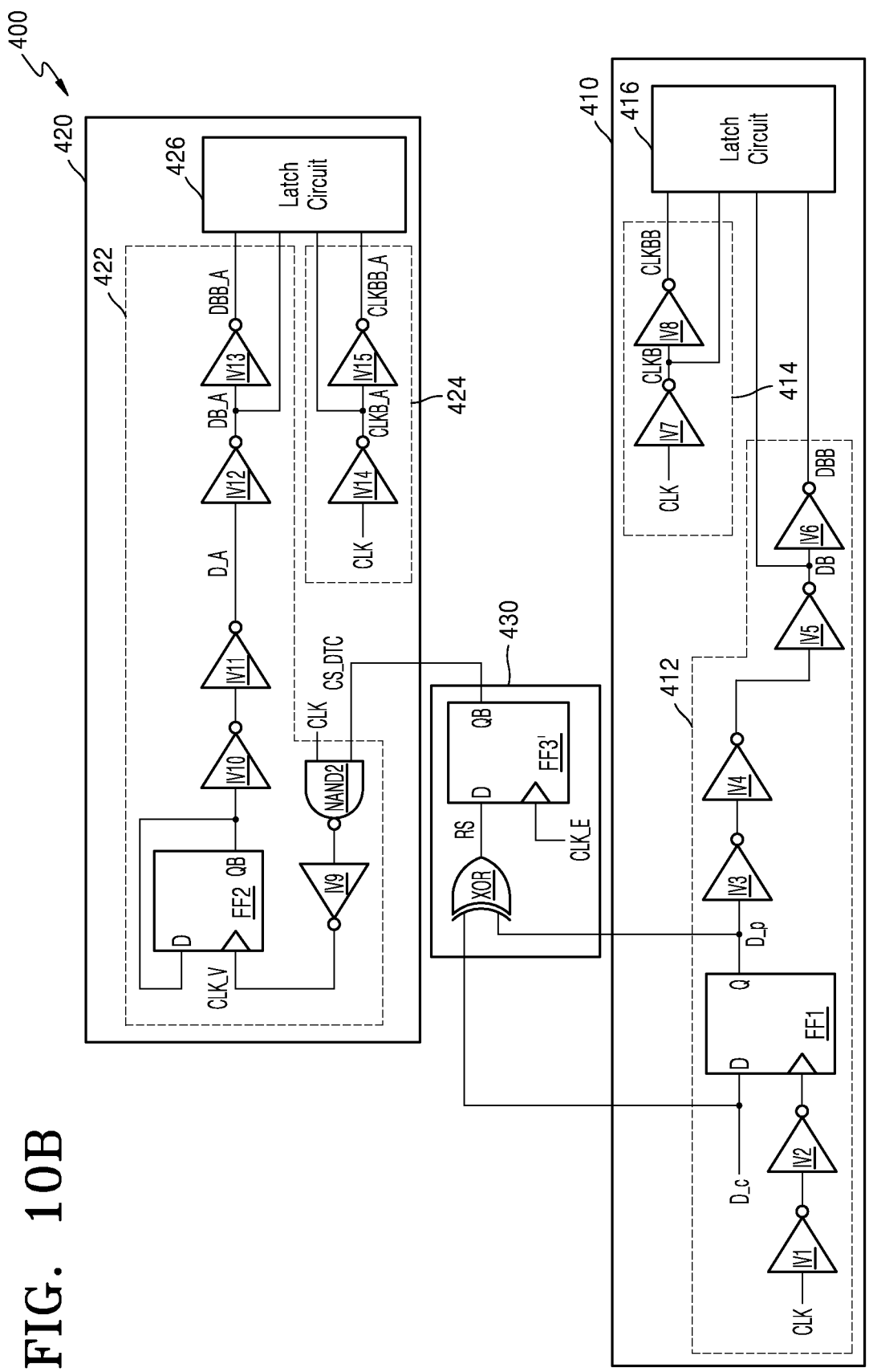
FIG. 10B is a detailed block diagram of the DAC of FIG. 10A according to an embodiment.

FIG. 10A is a diagram of a DAC 400 according to an embodiment. FIG. 10B is a diagram of the DAC 400 of FIG. 10A according to an embodiment.

Referring to FIG. 10A, the DAC 400 may include a normal path 410, an alternative path 420, and a path selector 430. The normal path 410 may receive the first clock signal CLK and the current digital data D_c. The alternative path 420 may receive the first clock signal CLK. The alternative path 420 may include a data toggling circuit 422 for internal toggling. The path selector 430 may receive the current digital data D_c, the previous digital data D_p, and the second clock signal CLK_E.

In an example embodiment, the path selector 430 may compare the current digital data D_c with the previous digital data D_p, based on the second clock signal CLK_E, and generate a toggling control signal CS_DTC, based on a comparison result. The path selector 430 may provide the toggling control signal CS_DTC to only the alternative path 420. The path selector 430 may control a selective operation of the data toggling circuit 422 using the toggling control signal CS_DTC.

Referring further to FIG. 10B, the DAC 400 may include the normal path 410, the alternative path 420, and the path selector 430. The DAC 400 is described below focusing on differences from the DAC 300 of FIG. 9. Compared to the DAC 300 of FIG. 9, a clock output circuit 414 of the normal path 410 may not include the first NAND gate NAND1, and the first clock signal CLK may be directly provided to the seventh inverter IV7. Accordingly, the clock output circuit 414 may continuously provide a latch circuit 416 with the first and second output clock signals CLKB and CLKBB generated from the first clock signal CLK. Compared to the DAC 300 of FIG. 9, a clock output circuit 424 may not include the third NAND gate NAND3, and the first clock signal CLK may be directly provided to the fourteenth inverter IV14. Accordingly, the clock output circuit 424 may continuously provide a latch circuit 426 with the first and second dummy clock signals CLKB_A and CLKBB_A generated from the first clock signal CLK.

Compared to the DAC 300 of FIG. 9, a third flip-flop FF3' of the path selector 430 may provide the data toggling circuit 422 with a signal, which has an opposite phase to the comparison result signal RS, as the toggling control signal CS_DTC at a rising edge of the second clock signal CLK_E.

In summary, in the DAC 400 of FIG. 10B, clock signals generated from the first clock signal CLK may be continuously provided to the latch circuits 416 and 426, and the internal toggling of the alternative path 420 according to an example embodiment may be controlled using the toggling control signal CS_DTC.

Figure 11:
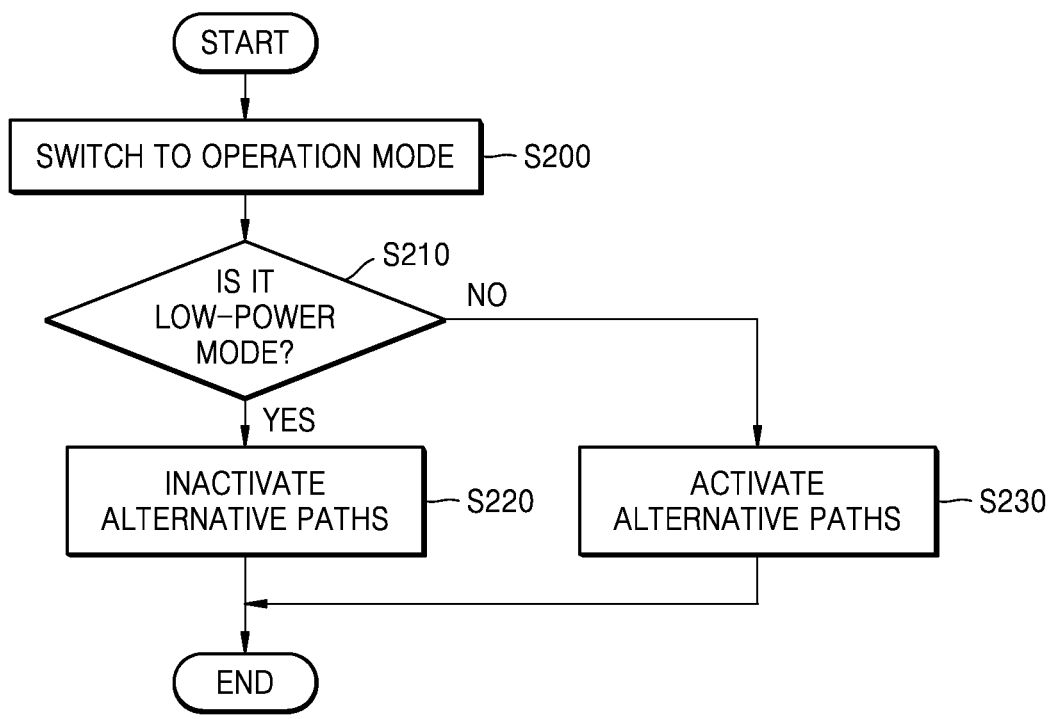
FIG. 11 is a flowchart of the operations of a DAC, according to an embodiment.

FIG. 11 is a flowchart of the operations of a DAC, according to an embodiment.

Referring to FIG. 11, the DAC may switch to a certain operation mode according to the status (e.g., battery status or communication status) of an apparatus including the DAC in operation S200. The DAC may determine whether the certain operation mode is a low-power mode in operation S210. When the answer is "YES" in operation S210, the DAC may deactivate alternative paths in operation S220. Otherwise, when the answer is "NO" in operation S210, the DAC may activate alternative paths in operation S230.

In some embodiments, the DAC may deactivate alternative paths when the communication status of the apparatus is at least a threshold value and thus good and activate the alternative paths when the communication status of the apparatus is less than the threshold value and thus poor. The DAC may activate or deactivate the alternative paths considering the communication status and operation mode of the apparatus in combination.

Figure 12:
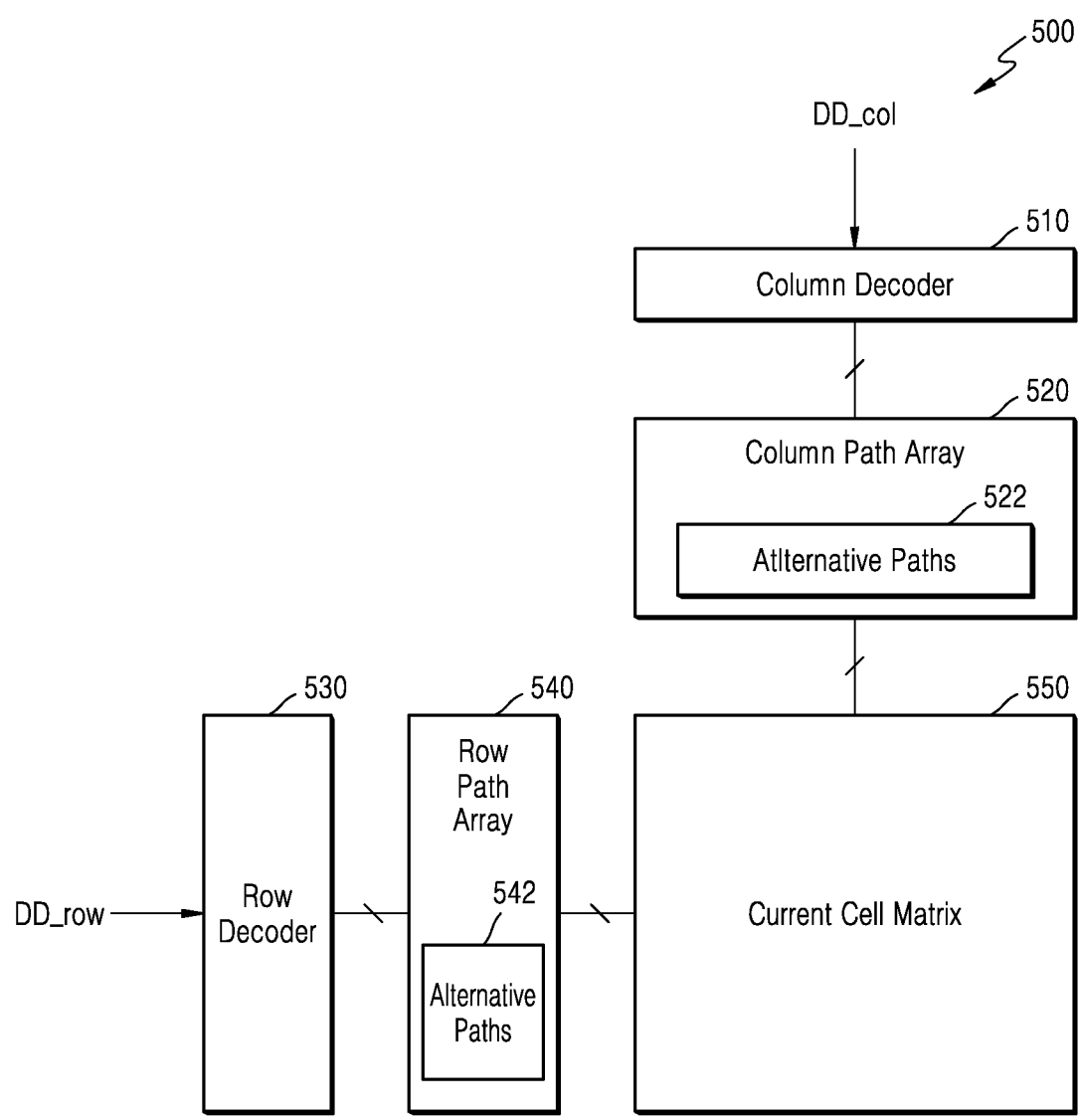
FIG. 12 is a diagram of a DAC according to an embodiment.

FIG. 12 is a diagram of a DAC 500 according to an embodiment.

Referring to FIG. 12, the DAC 500 may include a column decoder 510, a column path array 520, a row decoder 530, a row path array 540, and a current cell matrix 550. The column decoder 510 may receive and decode a plurality of pieces of column digital data DD_col, based on a thermometer code, and provide a plurality of pieces of decoded column digital data to the column path array 520. The column path array 520 may include a plurality of alternative paths 522 according to the example embodiments described above with reference to FIGS. 1 to 11. The column path array 520 may provide the current cell matrix 550 with column cell control signals for controlling current cells of the current cell matrix 550. The row decoder 530 may receive and decode a plurality of pieces of row digital data DD_row, based on a thermometer code, and provide a plurality of pieces of decoded row digital data to the row path array 540. The row path array 540 may include a plurality of alternative paths 542 according to the example embodiments described above with reference to FIGS. 1 to 11. The row path array 540 may provide the current cell matrix 550 with row cell control signals for controlling current cells of the current cell matrix 550. The current cell matrix 550 may output currents of various magnitudes, based on the column cell control signals and the row cell control signals, and the currents may be used to generate an analog signal.

Figure 13:
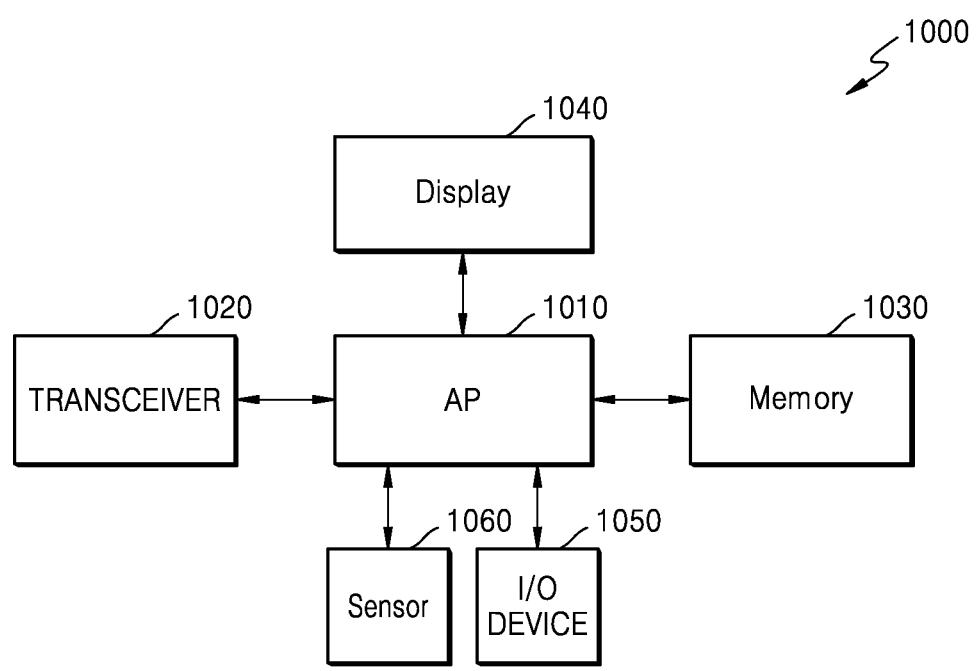
FIG. 13 is a diagram of an electronic apparatus according to an embodiment.

FIG. 13 is a diagram of an electronic apparatus 1000 according to an embodiment.

Referring to FIG. 13, the electronic apparatus 1000 may include an application processor (AP) 1010, a transceiver 1020, a memory 1030, a display 1040, an input/output (I/O) device 1050, and a sensor 1060.

The electronic apparatus 1000 may communicate with the outside world through the transceiver 1020. For example, the transceiver 1020 may include a WLAN communication interface, such as a local area network (LAN) interface, Bluetooth, Wireless Fidelity (Wi-Fi), or Zigbee, or a modem communication interface that may be connected to a mobile cellular network, such as a power line communication (PLC) network, a third-generation (3G) network, an LTE network, a 5G network, a new radio (NR) network, or a next generation communication network. The transceiver 1020 may include a DAC according to the embodiments described above.

The AP 1010 may generally control the operations of the electronic apparatus 1000 and the operations of elements of the electronic apparatus 1000. The AP 1010 may perform various operations. According to some embodiments, the AP 1010 may include a single-core processor or a multi-core processor.

The display 1040 may display internal status information of the electronic apparatus 1000. The display 1040 may include a touch sensor. The display 1040 may include an input or output function and an exterior for a user interface. A user may control the electronic apparatus 1000 through the touch sensor and the user interface.

The I/O device 1050 may include an input unit such as a touch pad, a keypad, or an input button and an output unit such as a display or a speaker. The memory 1030 may store instructions code for controlling the electronic apparatus 1000, control data, or user data. The memory 1030 may include at least one selected from volatile memory and non-volatile memory.

The sensor 1060 may include an image sensor, which senses images. The sensor 1060 may be connected to the AP 1010 and generate and provide image information to the AP 1010. The sensor 1060 may include a biosensor, which senses biometric information. The sensor 1060 may include an illuminance sensor, a sound sensor, an acceleration sensor, or the like.

The electronic apparatus 1000 may have a battery embedded therein for internal power supply or further include a power supply receiving external power. The electronic apparatus 1000 may further include a storage device. The storage device may include a non-volatile medium such as a hard disk drive (HDD), a solid state disk (SSD), an embedded multimedia card (eMMC), or universal flash storage (UFS). The storage device may store user information provided through the I/O device 1050 and sensed information collected through the sensor 1060.

At least some of the elements, e.g., the AP 1010, the transceiver 1020, the memory 1030, the display 1040, the I/O device 1050, and the sensor 1060, of the electronic apparatus 1000 may include a DAC for digital-to-analog conversion, and the embodiments may be applied to the DAC.

Figure 14:
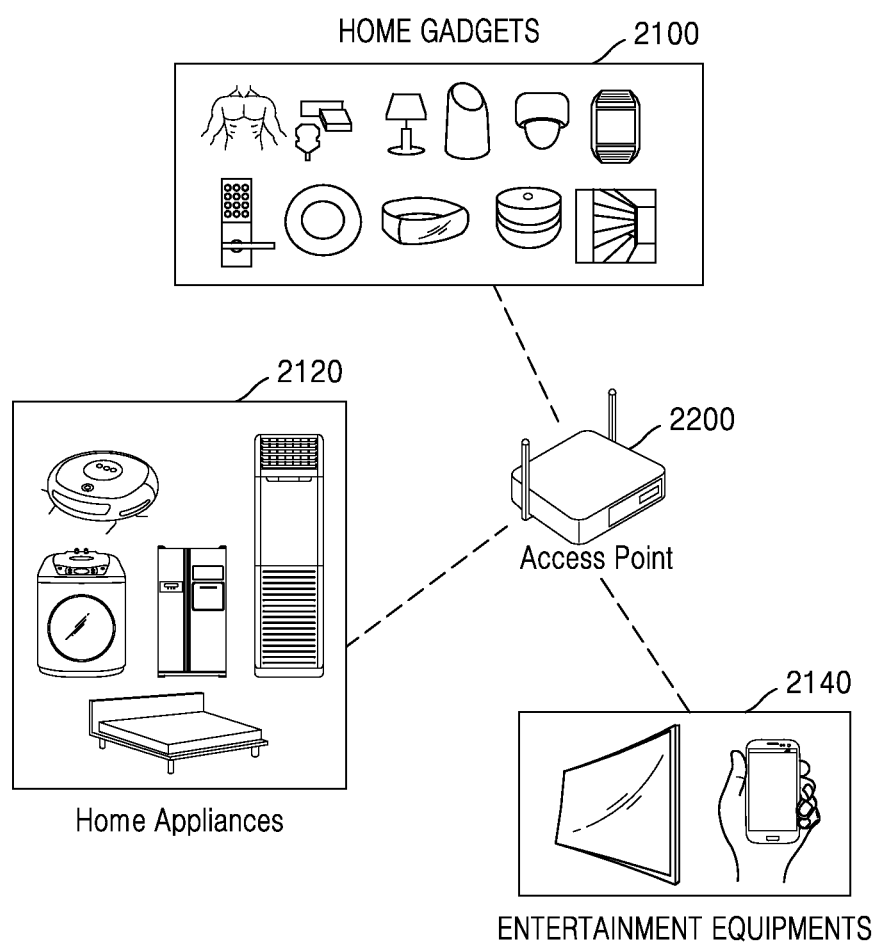
FIG. 14 is a diagram illustrating communication equipments including a DAC, according to an embodiment.

FIG. 14 is a diagram illustrating communication equipments including a DAC, according to an embodiment.

Referring to FIG. 14, home gadgets 2100, home appliances 2120, entertainment equipments 2140, and an access point 2200 may each include a DAC, which performs digital-to-analog conversion according to embodiments. In some embodiments, the home gadgets 2100, the home appliances 2120, the entertainment equipments 2140, and the access point 2200 may constitute an Internet of things (IoT) network. The communication equipments illustrated in FIG. 14 are just examples, and a DAC according to an example embodiment may also be included in other communication equipments than those illustrated in FIG. 14.

While the inventive concept has been particularly shown and described with reference to embodiments thereof, it will be understood that various changes in form and details may be made therein without departing from the spirit and scope of the following claims.

What is claimed is:

1. An apparatus configured to transmit and receive a radio frequency (RF) signal, the apparatus comprising:
   a digital-to-analog converter (DAC) configured to convert a digital signal into an analog signal;
   a power amplifier configured to amplify the analog signal; and
   an antenna configured to output, as the RF signal, the amplified analog signal to the outside,
   wherein the DAC comprises:
      a current cell matrix comprising a plurality of current cells configured to generate the analog signal;
      a plurality of normal paths configured to control the plurality of current cells to be turned on or off, based on the digital signal; and
      a plurality of alternative paths configured to selectively consume power and output dummy data, based on a pattern of the digital signal.

2. The apparatus of claim 1, wherein the digital signal includes a plurality of pieces of digital data;
   wherein each of the plurality of alternative paths comprises:
      a first latch circuit; and a data toggling circuit configured to selectively output the dummy data to the first latch circuit, the dummy data toggling based on a transition or a non-transition of a piece of digital data among the plurality of pieces of digital data corresponding to the dummy data.

3. The apparatus of claim 2, wherein each of the plurality of normal paths comprises:
a second latch circuit; and
a data output circuit configured to output, to the second latch circuit, the piece of digital data among the plurality of pieces of digital data,
wherein the first latch circuit is copied from the second latch circuit, and
wherein the data toggling circuit is copied from the data output circuit.

4. The apparatus of claim 2, wherein the data toggling circuit is further configured to:
output the dummy data that toggles to the first latch circuit, based on a current level of the piece of digital data being equal to a previous level of the piece of digital data; and
output the dummy data at a constant level to the first latch circuit based on the current level of the piece of digital data being different from the previous level of the piece of digital data.

5. The apparatus of claim 2, wherein at least one output terminal of the first latch circuit is in a floating state.

6. The apparatus of claim 2, wherein each of the plurality of alternative paths further comprises: a first clock output circuit configured to selectively output a dummy clock signal to the first latch circuit based on the transition or the non-transition of the piece of digital data.

7. The apparatus of claim 1, wherein the plurality of normal paths respectively correspond to the plurality of alternative paths.

8. The apparatus of claim 1, wherein a number of normal paths is greater than a number of alternative paths.

9. The apparatus of claim 1, wherein the plurality of alternative paths are further configured to be deactivated in a low-power mode of the apparatus.

10. The apparatus of claim 1, wherein the apparatus is implemented in a direct RF synthesis architecture, and
wherein the DAC is further configured to operate based on a clock signal having a frequency corresponding to a frequency band of the RF signal.

11. The apparatus of claim 1, wherein a first period in which data transmitted to a first latch circuit toggles is different from a second period in which data transmitted to a second latch circuit toggles,
wherein the first latch circuit is included in each of the plurality of alternative paths, and
wherein the second latch circuit is included in each of the plurality of normal paths.

12. The apparatus of claim 1, wherein the DAC further comprises a data decoder configured to decode an initial digital signal into the digital signal in a thermometer code format.

13. A digital-to-analog converter (DAC) configured to convert a digital signal comprising a plurality of pieces of digital data into an analog signal, the DAC comprising:
a data decoder configured to decode n-ary digital data into the plurality of pieces of digital data, based on a thermometer code, wherein n is an integer of at least 2;
a current cell matrix comprising a plurality of current cells configured to generate the analog signal;
a first alternative path comprising a first latch circuit configured to create a toggle in first dummy data;
a first normal path comprising a second latch circuit configured to control a first current cell among the plurality of current cells to be turned on or off; and
a first path selector configured to control at least one of the first alternative path and the first normal path, based on a pattern of first digital data among the plurality of pieces of digital data.

14. The DAC of claim 13, wherein the first path selector is further configured to
control the first alternative path to allow the first dummy data to toggle based on a current level of the first digital data being equal to a previous level of the first digital data, the first dummy data having been transmitted to the first latch circuit, and
control the first normal path to allow normal data to toggle based on the current level of the first digital data being different from the previous level of the first digital data, the normal data being transmitted to the second latch circuit and provided to the first current cell as a cell control signal.

15. The DAC of claim 13, further comprising:
a second alternative path comprising a third latch circuit configured to create a toggle in second dummy data;
a second normal path comprising a fourth latch circuit configured to control a second current cell among the plurality of current cells to be turned on or off; and
a second path selector configured to control at least one of the second alternative path and the second normal path, based on a pattern of second digital data among the plurality of pieces of digital data.

16. The DAC of claim 13, further comprising a second normal path configured to control a second current cell among the plurality of current cells to be turned on or off, based on a pattern of second digital data among the plurality of pieces of digital data.

17. The DAC of claim 13, wherein the first path selector comprises:
a comparison circuit configured to compare a current level of the first digital data with a previous level of the first digital data and generate a comparison result signal; and
a flip-flop configured to generate a first path selection signal and a second path selection signal from the comparison result signal and provide the first path selection signal to the first alternative path and the second path selection signal to the first normal path.

18. A digital-to-analog converter (DAC) configured to convert a digital signal comprising a plurality of pieces of digital data into an analog signal, the DAC comprising:
a current cell matrix comprising a plurality of current cells configured to generate the analog signal;
a plurality of normal paths connected to the plurality of current cells and configured to control turning the plurality of current cells on or off, based on the plurality of pieces of digital data; and
a plurality of alternative paths configured to selectively perform internal toggling on a plurality of pieces of dummy data, based on patterns of the plurality of pieces of digital data.

19. The DAC of claim 18, wherein each of the plurality of alternative paths is configured such that a first period in which dummy data of each of the plurality of alternative paths toggles is different from a second period in which normal data of a normal path toggles, the normal path corresponds to each of the plurality of alternative paths among the plurality of normal paths, and the normal data controls the turning the plurality of current cells on or off.

20. The DAC of claim 18, wherein each of the plurality of alternative paths is configured to perform the internal toggling based on a current level of digital data corresponding to each of the plurality of alternative paths among the plurality of pieces of digital data based equal to a previous level of the digital data.

* * * * *